United States Patent
Finn et al.

(10) Patent No.: US 7,143,334 B2
(45) Date of Patent: Nov. 28, 2006

(54) METHOD FOR DECODING DATA SEQUENCE ENCODED WITH AID OF BINARY CONVOLUTION CODE

(75) Inventors: Lutz Finn, München (DE); Sabine Rössel, München (DE); Gerhard Steib, München (DE)

(73) Assignee: Siemens Aktiengesellschaft, Munich (DE)

(*) Notice: Subject to any disclaimer, the term of this patent is extended or adjusted under 35 U.S.C. 154(b) by 42 days.

(21) Appl. No.: 10/509,038

(22) PCT Filed: Mar. 20, 2003

(86) PCT No.: PCT/EP03/02942

§ 371 (c)(1),
(2), (4) Date: Sep. 27, 2004

(87) PCT Pub. No.: WO03/081786

PCT Pub. Date: Oct. 2, 2003

(65) Prior Publication Data

US 2005/0166128 A1  Jul. 28, 2005

(30) Foreign Application Priority Data

Mar. 27, 2002  (DE) .............. 102 13 882
Mar. 27, 2002  (EP) .............. 02007030

(51) Int. Cl.
*H03M 13/03* (2006.01)

(52) U.S. Cl. ............... 714/792; 714/796

(58) Field of Classification Search ......... 714/755, 714/792, 794, 796
See application file for complete search history.

(56) References Cited

U.S. PATENT DOCUMENTS 6,028,899 A  2/2000  Peterson (Continued)

FOREIGN PATENT DOCUMENTS

WO  WO 96/13105  5/1996

OTHER PUBLICATIONS

Yufei Wu et al., "Forward Computation of Backward Path Metrics for MAP Decoder", Proceedings IEEE VTC May 2000, pp. 2257-2261.

(Continued)

*Primary Examiner*—Albert Decady
*Assistant Examiner*—Mujtaba K. Chaudry
(74) *Attorney, Agent, or Firm*—Staas & Halsey LLP

(57) ABSTRACT

A data sequence consisting of K information bits that has been encoded with the help of a binary convolution code is decoded using a MaxLogMAP algorithm. In a first calculation operation, metric values are calculated accurately in a forwards and backwards direction in a trellis diagram and only some of the values are stored in a memory as interpolation points for an additional calculation operation. The additional calculation operation uses the interpolation points to accurately calculate the metric values that lie between the interpolation points of the first calculation operation. Soft output values are accurately determined for decoding after n operations.

11 Claims, 4 Drawing Sheets

U.S. PATENT DOCUMENTS

| | | | |
|---|---|---|---|
| 6,226,773 B1* | 5/2001 | Sadjadpour | 714/794 |
| 6,452,979 B1* | 9/2002 | Ariel et al. | 375/265 |
| 6,813,743 B1* | 11/2004 | Eidson | 714/795 |
| 6,829,313 B1* | 12/2004 | Xu | 375/341 |
| 6,901,117 B1* | 5/2005 | Classon et al. | 375/341 |
| 6,950,476 B1* | 9/2005 | Tarrab et al. | 375/265 |
| 2001/0005406 A1* | 6/2001 | Mege et al. | 375/354 |
| 2001/0016932 A1* | 8/2001 | Tarrab et al. | 714/790 |
| 2002/0012408 A1* | 1/2002 | Nieminen | 375/341 |
| 2002/0034261 A1* | 3/2002 | Eidson et al. | 375/298 |
| 2002/0099998 A1* | 7/2002 | Nieminen | 714/792 |
| 2003/0043487 A1* | 3/2003 | Morita et al. | 360/25 |
| 2003/0101403 A1* | 5/2003 | Jeon et al. | 714/755 |

OTHER PUBLICATIONS

Joachim Hagenauer, "Iterative Decoding of Binary Block and Convolution Codes", IEEE Transactions on Information Theory, vol. 42, No. 2, Mar. 1996, pp. 429-445.

Andrew J. Viterbi, "An Intuitive Justification and a Simplified Implementation of the MAP Decoder for Convolutional Codes", IEEE Journal on Selected Areas in Communications, vol. 16, No. 2, Feb. 1998, pp. 260-264.

L. R. Bahl et al., "Optimal Decoding of Linear Codes for Minimizing Symbol Error Rate", IEEE Transactions on Information Theory, Mar. 1974, pp. 284-287.

* cited by examiner

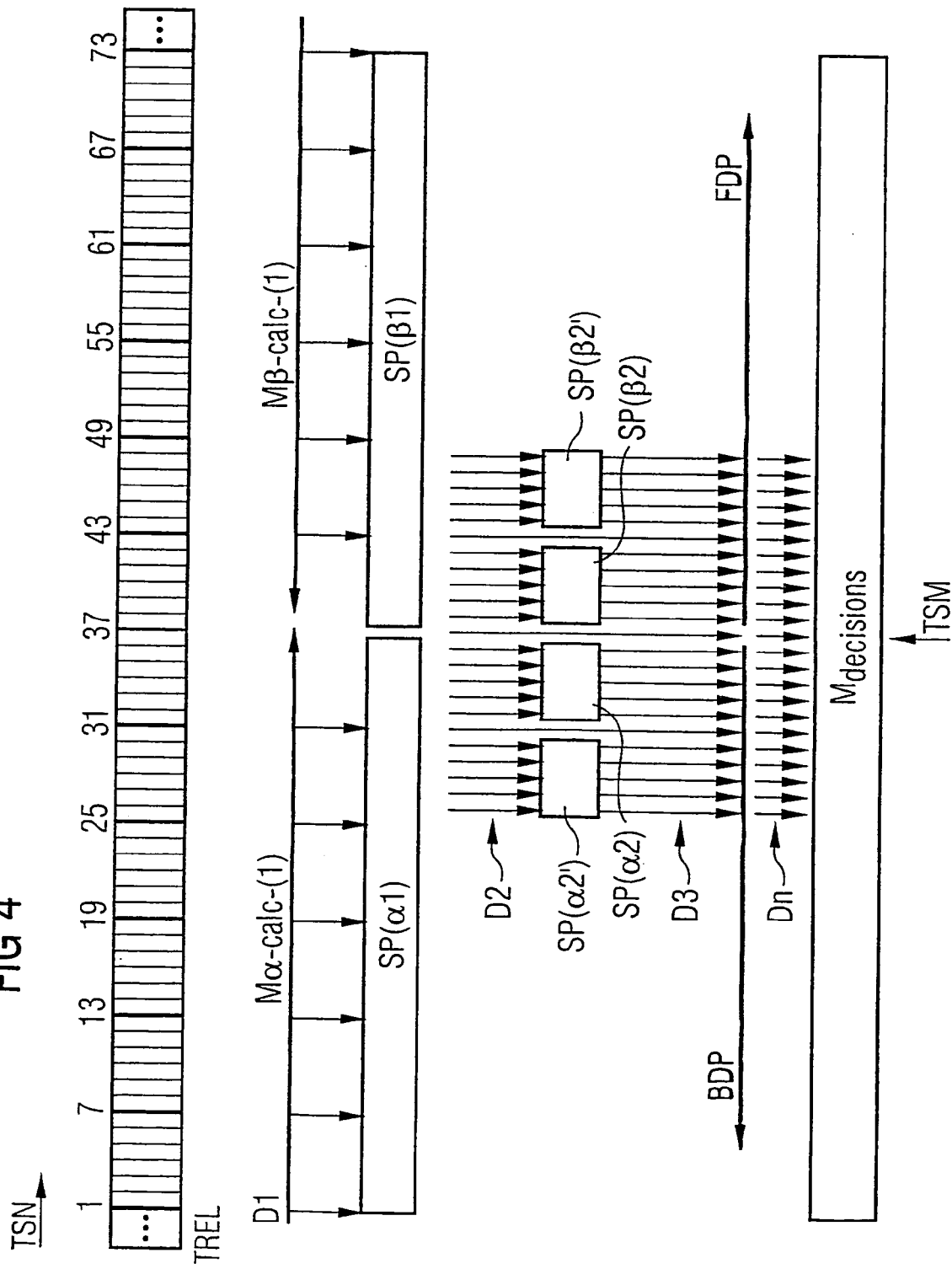

METHOD FOR DECODING DATA SEQUENCE ENCODED WITH AID OF BINARY CONVOLUTION CODE

CROSS REFERENCE TO RELATED APPLICATIONS

This application is based on and hereby claims priority to German Patent Application No. 102 13882.6 and European Patent Application No. 020 07 030.6, both filed on Mar. 27, 2002, the contents of which are hereby incorporated by reference.

BACKGROUND OF THE INVENTION

1. Field of the Invention

The present invention relates to a method for decoding a data sequence which consists of K information bits and has been encoded with the aid of a binary convolutional code, using a MaxLogMAP algorithm.

2. Description of the Related Art

Voice channels and data channels of a radio communications system, which is designed to operate to the GSM/EDGE mobile radio communications standard for example, use binary convolutional codes for data coding and data decoding. A preferred algorithm for what is known as "soft input/soft output decoding" is the known "symbol-by-symbol log-likelihood maximum a posteriori probability" algorithm (LogMAP algorithm), which is generally implemented with the aid of a maximum approximation (MaxLogMAP algorithm).

The basic MAP algorithm is described, for example, in the publication "Optimal Decoding of Linear Codes for Minimizing Symbol Error Rate", L. R. Bahl et al., IEEE Transactions on Information Theory, pp. 284–287, March 1974. The MaxLogMAP algorithm can be found in the publication "Iterative Decoding of Binary Block and Convolutional Codes", J. Hagenauer et al., IEEE Transactions on Information Theory, vol. 42, no. 2, pp. 429–445, March 1996.

A window MaxLogMAP algorithm implemented with the aid of what is known as a "sliding window" (decoding window) is described in the publication "An Intuitive Justification and a Simplified Implementation of the MAP Decoder for Convolutional Codes", A. J. Viterbi, IEEE Journal on Selected Areas in Communications, vol. 16, no.2, pp. 260–264, February 1998.

The basis for decoding a data sequence encoded with the aid of a binary convolutional code is the binary trellis diagram. One segment of the trellis diagram belonging to one information bit of the data sequence detects all possible combinations of m (convolutional code memory length) preceded information bits as $2^m$ initial states. Furthermore, all ensuing "conversions" (codings) of the information bit are detected as $2^{(m+1)}$ state transitions, and resulting $2^m$ target states are detected as initial states for the next consecutive information bit. Here an information bit sequence corresponds to a specific path within the trellis diagram, a sequence of the most probable information bits in the trellis diagram being established with the aid of the MaxLogMAP algorithm.

When the MaxLogMAP algorithm is implemented, a distinction essentially has to be made between a systolic implementation and a processor-oriented implementation.

With the systolic implementation the aim is to achieve as high a degree of parallelism as possible of decoding steps throughout the trellis diagram. This implementation is used with extremely high data throughput requirements of up to 50 Gbit/s.

Processor-oriented implementation is suitable for moderate data throughput requirements of a few Mbit/s using low-cost hardware.

For both implementations it is assumed that, for large data sequences transmitted block-by-block, decoding can be usefully implemented only with the aid of a decoding window.

For reasons of data throughput and hardware cost the window MaxLogMAP algorithm is generally used for decoding.

Decoding results (soft output values) which are, by way of comparison, obtained using a MaxLogMAP algorithm without a decoding window may be more precise, but expensive hardware and memories are required for this purpose.

An alternative to the MaxLogMAP algorithm, based on a block error probability with a given signal-to-noise ratio, is provided by the "soft output Viterbi algorithm" (SOVA) described in DE 39 10 739 C3 and DE 42 24 214 C2. However, the SOVA algorithm has a smaller correlation between decoding errors and soft output values formed than the MaxLogMAP algorithm.

SUMMARY OF THE INVENTION

An object of the present invention is to carry out a decoding of a data sequence encoded with the aid of a binary convolutional code, using a MaxLogMAP algorithm, in such a manner that precise soft output values are formed as decoding results with inexpensive hardware.

A method according to the invention may be a processor-oriented implementation of the MaxLogMAP algorithm.

As a result of the memory cascading according to the invention on the one hand and the use of interpolation nodes for metrics calculation on the other hand, the MaxLogMAP algorithm can be efficiently integrated on exactly one application-specific module (ASIC).

The non-use of a decoding window must not entail a loss of accuracy of the decoding results.

According to the invention the metrics values are calculated productively in a first calculation operation and reproductively in further calculation operations based on the stored interpolation nodes.

The memory cascading according to the invention enables an optimal data throughput to be achieved.

The method according to the invention saves memory space and therefore area on an ASIC module. The area saved is therefore available for further signal processing algorithms, which means that additional algorithms can be implemented in the ASIC module.

BRIEF DESCRIPTION OF THE DRAWINGS

These and other objects and advantages of the present invention will become more apparent and more readily appreciated from the following description of the preferred embodiments, taken in conjunction with the accompanying drawings of which:

These and other objects and advantages of the present invention will become more apparent and more readily appreciated from the following description of an exemplary embodiment, taken in conjunction with the accompanying drawings of which:

FIG. 4 is a diagrammatic representation for an example of the metrics value calculation and storage according to the invention.

DETAILED DESCRIPTION OF THE PREFERRED EMBODIMENT

Figure 1:
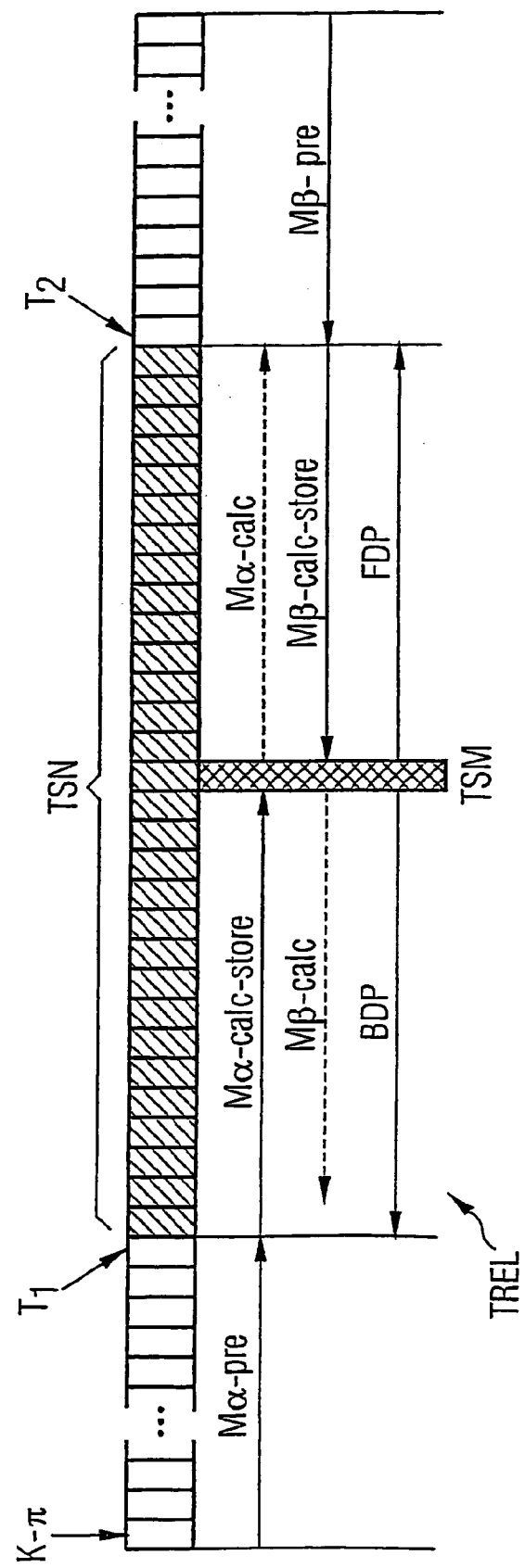
FIG. 1 is a diagrammatic representation of a MaxLog-MAP algorithm for the precision calculation of soft output values according to the related art.

Reference will now be made in detail to the preferred embodiments of the present invention, examples of which are illustrated in the accompanying drawings, wherein like reference numerals refer to like elements throughout.

FIG. 1 is a diagrammatic representation of a MaxLog-MAP algorithm for the precision calculation of soft output values according to the related art.

The MaxLogMAP algorithm is used to decode a data sequence which consists of K information bits and has been encoded with the aid of a binary convolutional code.

On a trellis diagram TREL, starting at a trellis segment T1, alpha metrics values Mα-calc-store are calculated and stored for every individual trellis segment TSN as logarithmic transition probabilities. At the same time, in parallel therewith, starting at a trellis segment T2, beta metrics values M-calc-store are calculated and stored for every individual trellis segment TSN.

The two calculations pass each other at a trellis segment TSM, a decision process being carried out from this time onwards for the purpose of calculating a soft output value, i.e. an information bit of the data sequence is decoded. When that happens, in the course of a "forward decision process" FDP, after the trellis segment TSM has been passed, currently calculated alpha metrics values Mα-calc are used with the previously calculated and stored beta metrics values Mβcalc-store to calculate the soft output value.

This procedure takes place at the same time in a "backward decision process" BDP, wherein currently calculated beta metrics values Mβ-calc are used with the previously calculated and stored alpha metrics values Mα-calc-store to calculate the soft output value.

The following reference characters are used below:

K number of information bits,
s state of a convolutional code decoding,
m code memory length,
T required number of trellis segments, where T=K+m, and
π length of a transient phase, where π>5*m With a word width w of a metrics memory and assuming that the respective metrics values are standardized, two metrics processors and a total of $2 \cdot K/2 \cdot w \cdot 2^m$ memory locations are required for this implementation of the MaxLog-MAP algorithm. The data throughput achieved is as follows:

$$\frac{1}{t_{segment} \cdot 10^6} [\text{Mbit/s}],$$

where the above parameter $t_{segment}$ is dependent on the module technology (ASIC) used to implement the algorithm, on the memory architecture and on the clock speed used with the ASIC module.

In the case of terminated codes, each calculation of the metrics values starts from the assumption of an uneven probability distribution in a trellis segment having an initial state with a probability of 100%, while all further states have a probability of 0%.

In the case of what are known as "tailbiting codes" no initial state is known at the outset. A transient phase of length π therefore has to be introduced for both directions. Associated metrics values for the transient phase are indicated as Mα-pre and Mβ-pre respectively.

Figure 2:
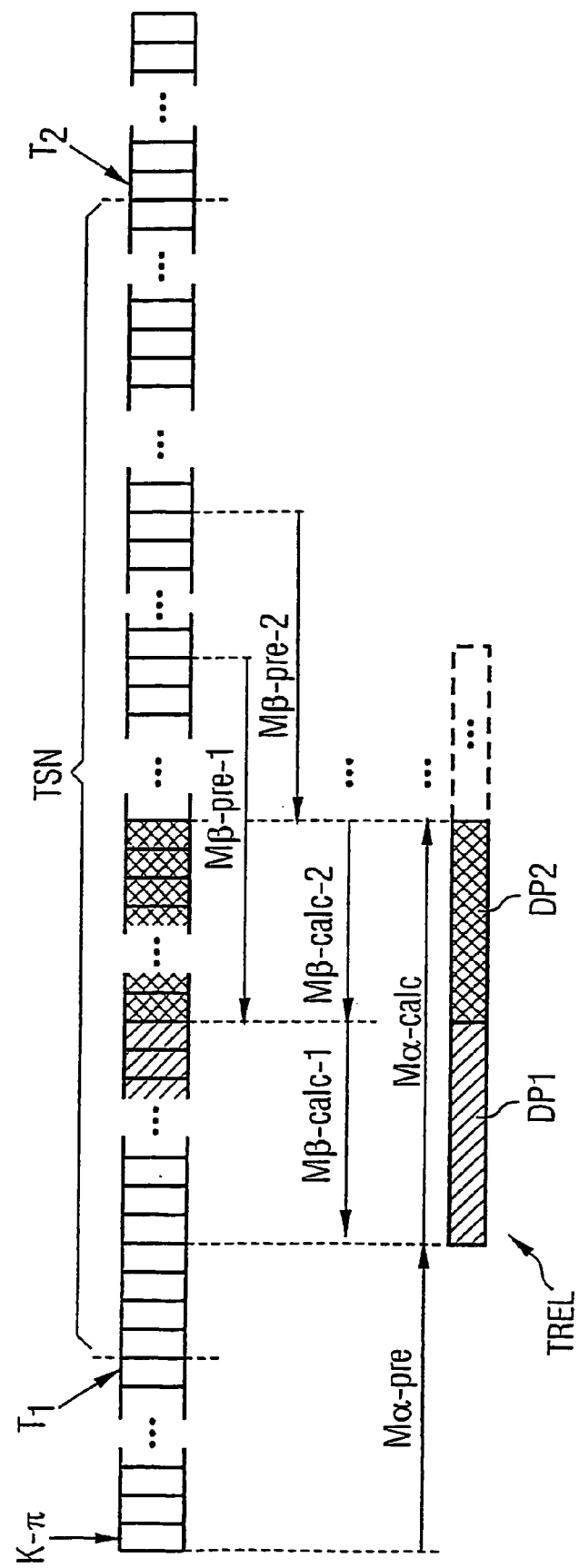
FIG. 2 is a diagrammatic representation of a window MaxLogMAP algorithm for the calculation of soft output values according to the related art.

FIG. 2 is a diagrammatic representation of a window MaxLogMAP algorithm for the calculation of soft output values according to the related art.

The window MaxLogMAP algorithm, which is implemented with the aid of a sliding decoding window, is used for long data sequences. The particular advantage of the window MaxLogMAP algorithm is its efficient implementation.

Similarly to FIG. 1, alpha metrics values Mα-calc are calculated precisely in a forward direction starting at a trellis segment T1. By contrast, beta metrics values Mβ-calc-1 of a first decoding window DP1 and beta metrics values Mβ-calc-2 of a second decoding window DP2 are estimated.

If the two decoding windows DP1 and DP2 reach the right-hand edge of the trellis diagram TREL, all the termination information is available. The beta metrics values Mβ-calc-1 and Mβ-calc-2 are calculated precisely, and the corresponding soft output values are formed.

Metrics values Mα-pre, Mβ-pre-1 and Mβ-pre-2 are again assigned to a transient phase.

The window MaxLogMAP algorithm is described in detail in the above-mentioned publication "An Intuitive Justification and a Simplified Implementation of the MAP Decoder for Convolutional Codes".

For this implementation, with a data throughput similar to that of FIG. 1, in total $\lceil w/\psi \rceil+1$ metrics processors and $(1+\theta) \cdot \psi \cdot w \cdot 2^m$ storage locations are required, where:

| | |
|---|---|
| $\psi$ | is the number of trellis segments for which $2^m$ metrics are stored in each case, |
| w | is the size of the decoding window in trellis segments, and |
| $\theta \in \{0,1\}$ | is a parameter which is dependent on the module technology (ASIC) used to implement the algorithm, on the memory architecture and on the clock speed used with the ASIC module. |

Especially where high speed channels have code rates close to one (generated with the aid of a points system), use of the decoding window leads to unacceptable deteriorations in performance, however.

Figure 3:
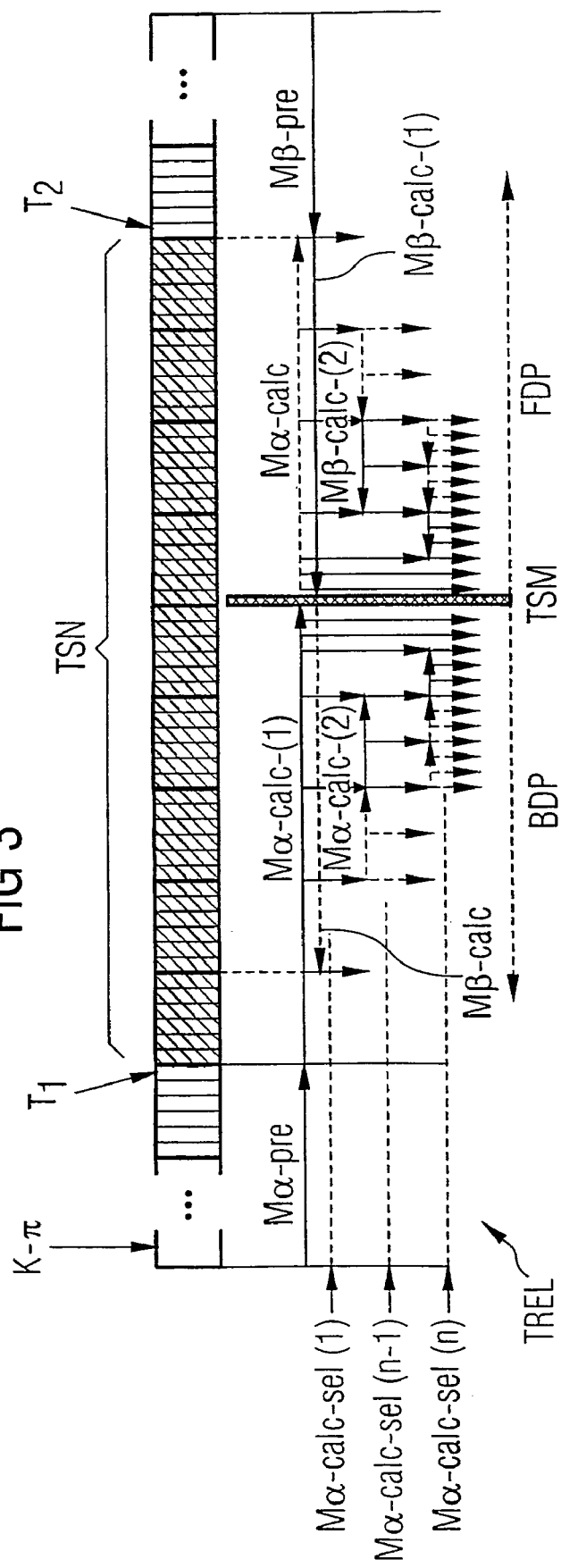
FIG. 3 is a diagrammatic representation of a MaxLog-MAP algorithm according to the invention for the precision calculation of soft output values.

FIG. 3 is a diagrammatic representation of a MaxLog-MAP algorithm according to the invention for the precision calculation of soft output values.

Similarly to FIG. 1, alpha metrics values are again calculated in a forward direction and beta metrics values in a backward direction of each trellis segment TSN. However, now, in accordance with the invention, only metrics values of a selected number of trellis segments which act as interpolation nodes are selected and stored.

In a preferred embodiment they are stored in a memory divided into levels in a cascaded manner.

The following reference characters are used below:

| | |
|---|---|
| m | code memory length, |
| sm | memory length shift of a feed-forward terminated code (in the case of a recursively terminated code and in the case of a tail-biting code sm = 0), |
| K | number of information bits, |
| T | required number of trellis segments, where T = K + m; |
| π | length of the transient phase where π > 5*m, |
| δ(1) | memory depth of a first memory level SP(1) for interpolation nodes of a first metrics value calculation, |
| δ(n − 1) | memory depth of an n − 1-th memory level SP(n − 1) for interpolation nodes of an n − 1-th metrics value calculation, and |
| δ(n) | memory depth of an n-th memory level SP(n) for interpolation nodes of an n − 1-th metrics value calculation. |

On the trellis diagram TREL, in a first operation, starting at a trellis segment T1, alpha metrics values Mα-calc(1) are calculated in a forward direction FDP and, starting at a trellis segment T2, beta metrics values Mβ-calc(1) are calculated in a backward direction BDP for each one of the trellis segments TSN as logarithmic transition probabilities.

According to the invention, however, from the calculated metrics values Mα-calc(1) and Mβ-calc(1) of the first operation, metrics values Mα-calc-sel(1) and Mβ-calc-sel(1) of the first operation are each now filed in a first memory level SP(1) with a memory depth of δ(1) for a selection of K/δ(1) trellis segments acting as interpolation nodes.

In a second operation, on the basis of each pair of adjacent interpolation nodes of the first operation, metrics values Mα-calc(2) and Mβ-calc(2) are calculated for the trellis segments TSN positioned between the respective interpolation nodes of the first operation.

As in the first operation, from the calculated metrics values Mα-calc(2) and Mβ-calc(2) of the second operation, for a selection of K/δ(1)/δ(2) trellis segments again acting as interpolation nodes the corresponding metrics values Mα-calc-sel(2) and Mβ-calc-sel(2) of the second operation are filed in a second memory level SP(2) with a memory depth of δ(2).

This metrics value calculation based on the interpolation nodes of a previous operation is accordingly continued both in a forward direction and in a backward direction. During this process, after the trellis segment TSM is passed, corresponding soft output values are formed, memory levels that are released being accordingly reused.

Here the decision process for the determination of the soft output values is as described in FIG. 1. The individual memory levels are arranged in a mutually cascaded structure.

After n operations all soft output values are determined, the n-th memory level having a memory depth of δ(n) with stored metrics values of K/δ(1)/δ(2)/ . . . /δ(n) trellis segments or interpolation nodes.

Comparing this with the data throughput stated in FIG. 1 and FIG. 2, the method according to the invention requires a total of 2·n metrics processors and $$\left(\sum_{i=1}^{n}(1+\theta_i)\cdot\delta_i\right)\cdot w\cdot 2^m$$

storage locations.

The following applies:

$$\prod_{i=1}^{n}\delta_i=K,\ \theta_i\in\{0,1\},$$

according to the number of ASIC clock cycles required for one trellis segment and the number of ports available on the memories.

On the basis of existing implementations of the MaxLog-MAP window algorithm, parameters can be deduced and can be used for a comparison between the conventional implementations known from FIG. 1 and FIG. 2 and the implementation according to the invention.

The results can be found in the following Table:

| | Logic [Kgates] | Memory [Kbit] | "Area" [Kgates] |
|---|---|---|---|
| MaxLogMAP | 101 | 1080 | 2300 |
| Window MaxLogMAP | 233 | 138 | 500 |
| Memory-cascaded implementation | 233 | 106 | 450 |

With the same data throughput and with no loss of accuracy in the MaxLogMAP algorithm as a result of the non-use of a decoding window, hardware costs for the memory-cascaded implementation according to the invention are reduced by over 80% compared with the conventional implementation described in FIG. 1.

The following assumptions were made for this comparison:

an overhead resulting from soft input and soft output buffer at a systems interface with $$(R^{-1}+1)\cdot w_{soft}\cdot k\cdot a_{memory},$$

where k=K generally applies but k=W+((n$_\beta$−1)*0) may apply to implementation with decoding window; where R is code rate, w$_{soft}$ is word width of the soft values and a$_{memory}$ is unit area per memory bit, an overhead resulting from control module and interface:

$$A_{overhead}.$$

a metrics processor including scaling of the register bits:

$$A_{viterbi}(w)\cdot f_{parallel}+2^{(m+1)}\cdot w\cdot a_{flipflop}$$

where A$_{viterbi}$ represents the Viterbi arithmetic for a given word width w and a$_{flipflop}$ represents the register unit area per bit, f$_{parallel}$ is the number of butterfly calculations made in an ASIC clock cycle and can assume the following values: $\{1,2,\ldots,2^{(m-1)}\}$, a metrics word width w=16, a soft value word width w$_{soft}$=8, a memory bit area a$_{memory}$=2, a register bit area a$_{flipflop}$=10 units, a Viterbi arithmetic/butterfly A$_{viterbi}$=12500 units, an overhead A$_{overhead}$=50000 units.

The units correspond to a gate equivalent of a 0.18 μm ASIC module at a clock frequency of approx. 150 MHz.

Data from a parameter set relevant to the GSM/EDGE standard are compared below:

| | code rate | R = 1/6 |
|---|---|---|
| | memory length | m = 6 |
| | block size | K = 1000 |
| | decoder throughput | greater than 2 Mbit/s |
| | parallelism | $f_{parallel} = 1$ |

| | Configuration (@ 2.6 Mbit/s) | "Area" [Kgates] |
|---|---|---|
| Exact implementation | 2 metrics processors | 2250 |
| Window implementation (path fusion limit = 160) window also with soft input and soft output memory | 7 metrics processors $(1 + \theta)$ metrics memory with $\delta = 32, \theta = 1$ 1 soft input and soft output memory with window | 480 |
| Window implementation (path fusion limit = 160) | 6 metrics processors $(1 + \theta)$ metrics memory with $\delta = 40, \theta = 1$ 1 soft input and soft output memory | 500 |
| Window implementation (path fusion limit = 160) | 5 metrics processors $(1 + \theta)$ metrics memory with $\delta = 54, \theta = 0$ 1 soft input and soft output memory | 425 |
| Memory-cascaded implementation | 6 metrics processors interpolation nodes memory at the $1^{st}$ level with $\delta_1 = 18$; $(1 + \theta_2) * 2$ interpolation nodes memory at the $2^{nd}$ level with $\delta_2 = 8, \theta_2 = 1; (1 + \theta_3) * 2$ metrics memories with $\delta_3 = 7$, $\theta_3 = 1$; 1 soft input and soft output memory | 450 |
| Memory-cascaded implementation | 6 metrics processors 2 interpolation nodes memories at the $1^{st}$ level with $\delta_1 = 18$; $(1 + \theta_2) * 2$ interpolation nodes memory at the $2^{nd}$ level with $\delta_2 = 10, \delta_1 = 10; \theta_2 = 0$; $(1 + \theta_3) * 2$ metrics processors with $\delta_3 = 10, \theta_3 = 0$; 1 soft input and soft output memory | 400 |

In the case of UMTS (W-CDMA) and with UTRAN TDD convolutional codes, the following parameters are to be used for the convolutional decoding:

| | code rate | R = 1/3 |
|---|---|---|
| | memory length | m = 8 |
| | maximum block size | K = 300 |
| | decoder throughput | greater than 2 Mbit/s |
| | parallelism | $f_{parallel} = 8$ |

| | Configuration (@ 3.125 Mbit/s) | "Area" [Kgates] |
|---|---|---|
| Exact implementation | 2 metrics processors | 2891 |
| Window implementation with sliding window on soft input/ soft output memory | 6 metrics processors $\delta = 40, \theta = 1$ | 1848 |
| Memory-cascaded implementation | 4 metrics processors $\delta_1 = 20, \delta_2 = 15$ $\theta_1 = 0, \theta_2 = 1$ | 1206 |

In the case of UMTS (W-CDMA) and with UTRAN TDD turbo codes a slightly expanded MaxLogMAP decoder can be used as part of the turbo-decoding. This means that, here too, memory-cascaded implementation can be compared with direct and window implementation:

| | code rate | R = 1/3 |
|---|---|---|
| | memory length | m = 3 |
| | maximum block size | K = 5200 |
| | decoder throughput | greater than 2 Mbit/s |
| | parallelism | $f_{parallel} = 1/4$ |

| | Configuration (@ 3.125 Mbit/s) | "Area" [Kgates] |
|---|---|---|
| Exact implementation | 2 metrics processors | 1727 |
| Window implementation with sliding window also for soft input/soft output memory | 6 metrics processors $\delta = 40, \theta = 1$ | 159 |
| Memory-cascaded implementation | 8 metrics processors $\delta_1 = 13; \delta_2 = 10, \delta_3 = 8, \delta_4 = 5$ $\theta_1 = 0, \theta_i = 1$ for $i = \{2, 3, 4\}$ | 448 |

FIG. 4 shows an example of metrics value calculation and storage according to the invention.

In a first operation D1, alpha metrics values and beta metrics values are calculated. For each sixth trellis segment TSN=1, 7, 13, . . . , 73 acting as interpolation point, $2^m$ calculated alpha metrics values are stored in a memory level SP($\alpha$1) and $2^m$ calculated beta metrics values are stored in a memory level SP($\beta$1).

In a second operation D2, these metrics values are read out of the memory levels SP($\alpha$1) and SP($\beta$1) and, for the trellis segments positioned between the interpolation nodes, the associated alpha metrics values and beta metrics values are calculated precisely. Relevant trellis segments are again selected as interpolation nodes, and the associated metrics values are stored. Two memory levels SP($\alpha$2) and SP($\alpha$2'), and SP($\beta$2)and SP($\beta$2'), respectively, are indicated here by way of example.

In a third operation D3, the trellis segment TSM is reached from both sides, and currently calculated $2^m$ beta metrics values with stored $2^m$ alpha metrics values filed in the memory SP($\alpha$2) are used for the backward decision process to determine soft output values. In exactly the same way, currently calculated $2^m$ alpha metrics values with stored $2^m$ beta metrics values filed in the memory SP($\beta$2) are used for the forward decision process to determine soft output values.

After a total of n=3 operations Dn all the decisions values $M_{decisions}$ were formed.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. A method for decoding a data sequence of K information bits encoded with aid of a binary convolutional code, comprising:
   calculating in a first operation, on a trellis diagram having trellis segments, first metric values of all trellis segments for a forward direction and for a backward direction using a MaxLogMAP algorithm without a decoding window;

selecting a first set of trellis segments as first interpolation nodes from the first operation;

storing first associated metric values for the first set of trellis segments in a first memory level;

iteratively performing a number of n operations until the metric values for the forward direction and for the backward direction meet in one trellis segment, including:

calculating in an i-th operation for $1 < i \leq n$, i-th metric values of internodal trellis segments positioned between the interpolation nodes of an i−1-th operation for the forward and the backward directions using stored metric values of interpolation nodes of the i−1-th operation, selecting an i-th set of trellis segments as i-th interpolation nodes from the i-th operation, and storing i-th associated metric values for the i-th set of trellis segments in an i-th memory level; and carrying out a decision process to calculate soft output values for decoding.

2. A method according to claim 1, further comprising:

assigning a memory depth of $\delta 1$ for each direction of the first memory level, and wherein said storing of the first associated metric values in the first memory level uses each K/δ1-th trellis segment.

3. A method according to claim 2, further comprising:

assigning a memory depth of $\delta i$ for each direction of the i-th memory level, and wherein said storing of the first associated metric values in the first memory level uses each K/δ1/ . . . /δi-th trellis segment.

4. A method according to claim 3, wherein a delayed decision phase is used in calculating the soft output values for terminated codes.

5. A method according to claim 4, wherein the decoding is carried out on a single application-specific module.

6. A method according to claim 3, wherein the decoding is carried out on a single application-specific module.

7. A method according to claim 2, wherein a delayed decision phase is used in calculating the soft output values for terminated codes.

8. A method according to claim 2, wherein the decoding is carried out on a single application-specific module.

9. A method according to claim 1, further comprising:

assigning a memory depth of $\delta i$ for each direction of the i-th memory level, and wherein said storing of the first associated metric values in the first memory level uses each K/δ1/ . . . /δi-th trellis segment.

10. A method according to claim 1, wherein a delayed decision phase is used in calculating the soft output values for terminated codes.

11. A method according to claim 1, wherein the decoding is carried out on a single application-specific module.

* * * * *